United States Patent
Zeitzoff et al.

(10) Patent No.: US 9,219,062 B2
(45) Date of Patent: Dec. 22, 2015

(54) INTEGRATED CIRCUITS WITH IMPROVED SOURCE/DRAIN CONTACTS AND METHODS FOR FABRICATING SUCH INTEGRATED CIRCUITS

(71) Applicant: GLOBALFOUNDRIES, Inc., Grand Cayman, KY (US)

(72) Inventors: Peter Zeitzoff, Clifton Park, NY (US); Abhijeet Paul, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 41 days.

(21) Appl. No.: 13/902,459

(22) Filed: May 24, 2013

(65) Prior Publication Data

US 2014/0346605 A1 Nov. 27, 2014

(51) Int. Cl.
*H01L 21/70* (2006.01)
*H01L 27/088* (2006.01)
*H01L 29/66* (2006.01)
*H01L 29/417* (2006.01)
*H01L 29/78* (2006.01)
*H01L 21/8234* (2006.01)

(52) U.S. Cl.
CPC ...... *H01L 27/0886* (2013.01); *H01L 29/41791* (2013.01); *H01L 29/66795* (2013.01); *H01L 29/785* (2013.01); *H01L 21/823418* (2013.01); *H01L 21/823431* (2013.01)

(58) Field of Classification Search
CPC ............ H01L 29/66795; H01L 29/785; H01L 29/41791; H01L 27/0886; H01L 21/823418; H01L 21/823431

See application file for complete search history.

(56) References Cited

U.S. PATENT DOCUMENTS

| | | | |
|---|---|---|---|
| 2008/0296666 A1* | 12/2008 | Iijima | 257/327 |
| 2010/0155846 A1* | 6/2010 | Mukherjee et al. | 257/365 |
| 2012/0139015 A1* | 6/2012 | Yu et al. | 257/288 |
| 2013/0175626 A1* | 7/2013 | Cheng et al. | 257/347 |
| 2014/0124842 A1* | 5/2014 | Wang et al. | 257/288 |
| 2014/0183645 A1* | 7/2014 | Wann et al. | 257/369 |

* cited by examiner

*Primary Examiner* — Victor A Mandala
(74) *Attorney, Agent, or Firm* — Ingrassia Fisher & Lorenz, P.C.

(57) ABSTRACT

Integrated circuits and methods for fabricating integrated circuits are provided. In accordance with an exemplary embodiment, an integrated circuit includes a semiconductor substrate with a fin structure overlying the semiconductor substrate and having a source region, a drain region, and a channel region between the source region and drain region. The source region and the drain region each have a recessed surface. A source contact is adjacent the recessed surface in the source region and a drain contact is adjacent the recessed surface in the drain region. Linear current paths are defined from the channel region to the source contact and from the channel region to the drain contact.

20 Claims, 7 Drawing Sheets

INTEGRATED CIRCUITS WITH IMPROVED SOURCE/DRAIN CONTACTS AND METHODS FOR FABRICATING SUCH INTEGRATED CIRCUITS

TECHNICAL FIELD

The present disclosure generally relates to integrated circuits and methods for fabricating integrated circuits, and more particularly relates to integrated circuits with improved source/drain contacts on non-planar transistor structures and methods for fabricating such integrated circuits.

BACKGROUND

In contrast to conventional planar metal-oxide-semiconductor field-effect transistors ("MOSFETs"), multi-gate transistors incorporate a gate on two or more sides of a single device. For highly scaled technology nodes, multi-gate transistors can have reduced off-state current leakage, increased on-state current flow, and reduced overall power consumption compared to conventional single-gate transistors. Because multi-gate devices have non-planar topographies, they also tend to be more compact than conventional planar transistors and consequently permit higher device densities to be achieved.

One known type of non-planar, multi-gate transistor, commonly referred to as a "finFET," includes one or more parallel fins ("fin structures") formed on a semiconductor substrate. The fin structures extend along a first axis between common source and drain electrodes. At least one conductive gate structure is formed over the fin structures and extends along a second axis generally perpendicular to the first axis. More specifically, the gate extends across and over the fin structures such that an intermediate region of the gate conformally overlays three surfaces of each fin (i.e., an upper surface, a first sidewall surface, and a second opposing sidewall surface of each fin).

While providing the advantages noted above, finFETs have some drawbacks. In particular, parasitic source/drain resistance is a significant issue for non-planar transistor devices at highly scaled technology nodes.

Accordingly, it is desirable to provide integrated circuits that include finFETs with reduced parasitic source/drain resistance, along with methods for fabricating such integrated circuits. To reduce the finFET parasitic resistance, it is desirable to produce transistors that provide increased surface length of the contacts in the source/drain and improved source/drain contacts, such that when the transistor is turned on, shorter, straighter current paths are provided in the source/drain from the channel to the contacts. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, an integrated circuit includes a semiconductor substrate with a fin structure overlying the semiconductor substrate and having a source region, a drain region, and a channel region between the source region and drain region. The source region and the drain region each have a recessed surface. A source contact is adjacent the recessed surface in the source region and a drain contact is adjacent the recessed surface in the drain region. Linear current paths are defined from the channel region to the source contact and from the channel region to the drain contact.

In another embodiment, an integrated circuit includes a semiconductor substrate with a fin structure overlying the semiconductor substrate and having a source region and a drain region. The integrated circuit includes a first gate structure transversely overlying the fin structure and defining a channel region between the source region and the drain region. Contacts are formed in the source region and drain region, and each contact defines a contact surface having a length. Further, the integrated circuit includes a second gate structure transversely overlying the fin structure and distanced from the first gate structure by a first distance D, wherein D/2 is less than the length of each contact surface.

In accordance with another embodiment, a method for fabricating an integrated circuit is provided. The method includes forming a fin structure overlying a semiconductor substrate and having a source region, a drain region, and a channel region between the source region and the drain region. A first gate structure is formed transversely overlying the channel region of the fin structure. The method includes forming a trench in the source region and a trench in the drain region. Also, a source contact is formed in the trench in the source region and a drain contact is formed in the trench in the drain region. The method defines linear current paths from the channel region through the drain region to the drain contact and from the channel region through the source region to the source contact.

BRIEF DESCRIPTION OF THE DRAWINGS

Embodiments of integrated circuits that provide improved source/drain contacts on non-planar transistor structures and methods for fabricating such integrated circuits will hereinafter be described in conjunction with the following drawing figures, wherein like numerals denote like elements, and wherein.

DETAILED DESCRIPTION

The following detailed description is merely exemplary in nature and is not intended to limit integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits with improved source/drain contacts and methods for fabricating such integrated circuits are provided. With these novel integrated circuits and methods, problems faced by conventional processes when forming contacts on non-planar transistor structures, such as fin structures, may be avoided. For example, parasitic source/drain resistance is reduced compared to conventional non-planar transistor structures. It is contemplated herein that source and drain contacts be formed to allow short, linear current paths to form from the channel through the source/drain regions to the contact. These current paths allow for reduced parasitic source/drain resistance as compared to longer, curved current paths in conventional finFETs. Further, the source and drain contacts disclosed herein are formed with contact surfaces that are recessed and transverse to the fin structure. As a result, the source and drain contacts can be provided with contact lengths that significantly exceed the contact lengths in conventional finFETs. The short, linear current paths and the increase in effective contact length can significantly reduce parasitic source/drain resistance.

FIGS. 1-11 illustrate steps of methods for fabricating integrated circuits in accordance with various embodiments. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
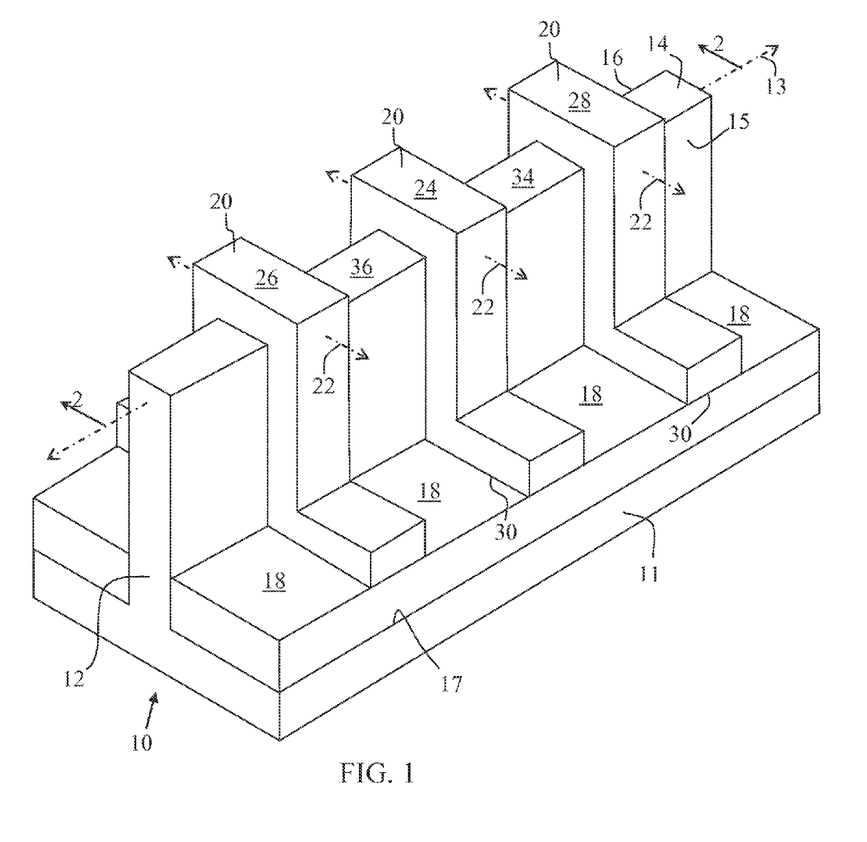
FIG. 1 illustrates, in perspective view, a portion of an integrated circuit with gates overlying a non-planar structure for further processing in accordance with various embodiments herein.
Figure 2:
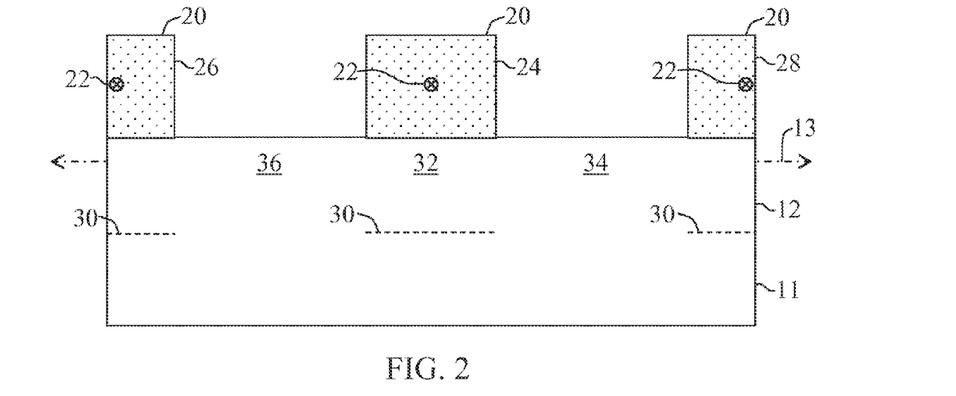
FIGS. 2-11 illustrate, in cross-sectional view, a portion of the integrated circuit of FIG. 1 taken along line 2-2, during formation of improved source/drain contacts and current flow and method steps for fabricating such an integrated circuit in accordance with various embodiments herein.

FIGS. 1 and 2 illustrate steps in an exemplary embodiment of a method for fabricating an integrated circuit 10. FIG. 1 is a perspective view of a portion of an integrated circuit 10, and FIG. 2 is a cross-sectional view taken along line 2-2 in FIG. 1. As shown, the method begins by providing a semiconductor substrate 11, such as a bulk silicon wafer, a silicon-on-insulator wafer, or a wafer of other semiconductor material. A non-planar structure 12, such as fin structure, is formed on the semiconductor substrate 11. The fin structure 12 extends in the direction of a fin axis 13 and has a top surface 14 and side surfaces 15 and 16 (shown only in FIG. 1). The fin structure 12 is formed according to known processes. For instance, when using a bulk semiconductor substrate 11, upper portions of the semiconductor material of the semiconductor substrate 11 are etched or otherwise removed leaving fin structures 12 formed between a lowered surface 17 (shown only in FIG. 1) of the remaining semiconductor material and supported by the remaining semiconductor substrate 11. Between adjacent fin structures 12 (FIGS. 1 and 2 illustrate only one fin structure 12), a dielectric layer 18 (shown only in FIG. 1), such as silicon oxide, may be deposited on the surface 17 of the semiconductor substrate 11.

In FIGS. 1 and 2, gates 20 are formed across the fin structure 12 and extend in the direction of gate axes 22 substantially perpendicular to the fin axis 13. FIG. 1 illustrates one central gate 24, and adjacent gates 26 and 28, while FIGS. 2-11 illustrate central gate 24 and portions of gates 26 and 28 adjacent central gate 24. For clarity, discussion of other elements of the integrated circuit 10 is made with reference to central gate 24; however, the identification of gates 24, 26, and 28 is with reference only to the layout of the figures and is not intended to structurally distinguish gates 24, 26 and 28. Further, each gate 24, 26 and 28 may be substantially identical, though the relative position of source and drain regions may be reversed for alternating gates 20. The gates 20 are formed by typical lithographic processing and extend over side surfaces 15 and 16 of the fin structure 12 to lower gate surfaces 30. Typically, the lower gate surfaces 30 are formed over the dielectric layer 18 deposited between the fin structure 12 and adjacent fin structures as is well-known. Gate oxide and/or nitride capping layers (not shown) may first be deposited over the fin structure 12 before formation of the gates 20. As shown, the exemplary fin structure 12 has a channel region 32 (shown in FIG. 2), a source region 34 and a drain region 36 defined in relation to gate 24.

The gates 20 may be formed from a conductor such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The gates 20 may be a layered structure such as a high-k dielectric and conductor stack. The high-k gate dielectric may include but is not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, any suitable combination of those high-k materials, or any suitable combination of any high-k material with silicon oxide, silicon nitride, and/or silicon oxynitride. The gate conductor may be one or more of the conductors listed above, or any suitable combination of these materials.

Figure 3:
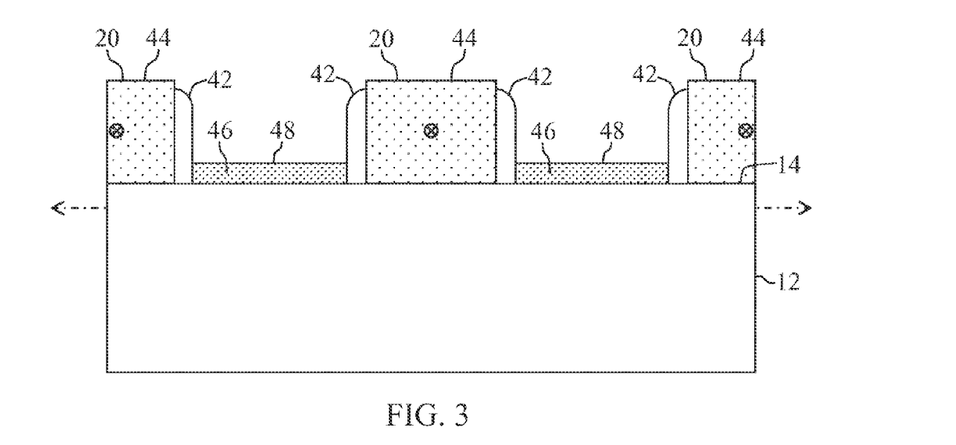

In FIG. 3, first spacers 42 are formed on the top surface 14 of the fin structure 12 and around the gates 20 using known deposition and etch steps. The gates 20 and first spacers 42 may be considered to form gate structures 44. While first spacers 42 may be formed from any suitable material, in an exemplary embodiment they are formed from silicon nitride. As shown, an epitaxial material 46, such as epitaxial silicon, is grown on the top surface 14 of the fin structure 12 between first spacers 42 and forms a top surface 48 substantially parallel to the top surface 14 of the fin structure 12. In certain embodiments, the silicon surface on which the epitaxial material is grown is recessed first. Further, the epitaxial material may be different than silicon, e.g., silicon-germanium.

Figure 4:
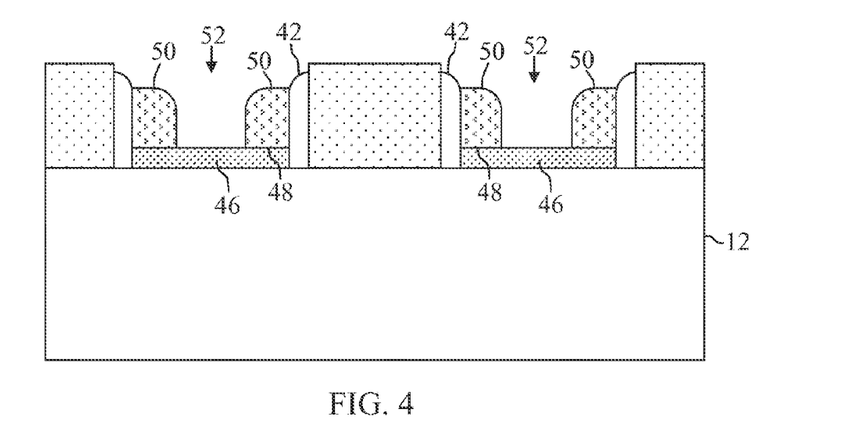

In FIG. 4, according to an embodiment, second spacers 50 are formed on the top surface 48 of the epitaxial material 46 and adjacent the first spacers 42. Second spacers 50 may be formed from any suitable material, but in an exemplary embodiment they are formed from a material that may be selectively etched from the first spacers 42 without etching the first spacers 42. For example, if the first spacers 42 are formed from silicon nitride, the second spacers 50 may be formed from silicon dioxide. Further, exemplary second spacers 50 provide for selective etching of the epitaxial material 46 and fin structure 12. As shown, the second spacers 50 define exposed regions 52 of the epitaxial material 46 and the underlying fin structure 12. In order to control the size of the exposed regions 52, the width of second spacers 50 may be adjusted by the spacer material deposition and etch processes.

Figure 5:
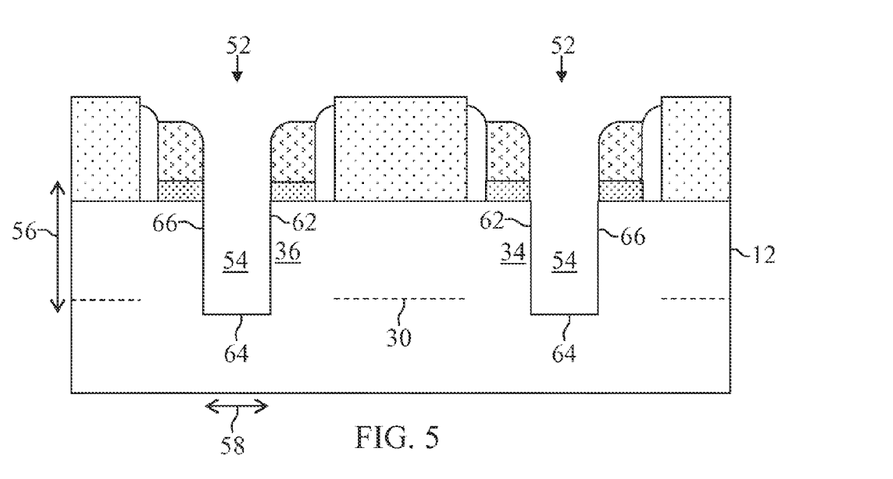

In FIG. 5, the epitaxial material 46 and fin structure 12 in the exposed regions 52 are anisotropically etched to form trenches 54 in both the source region 34 and the drain region 36. The etch may be performed with any suitable anisotropic etchant (typically a "dry etch") selective to the epitaxial material 46 and fin structure 12. The trenches 54 are formed with a selected depth, indicated by double-ended arrow 56, and a selected width, indicated by double-ended arrow 58. As shown, the exemplary trench 54 is formed with a depth 56 extending below the lower gate surfaces 30, although the trench 54 may be formed at a shallower depth that is above the lower gate surfaces 30. The depth 56 is dependent on the duration of the etch process, and the width 58 is dependent on the thickness of the second spacers 50. While the trench 54 may be formed with any appropriate dimensions, in an exemplary embodiment the depth 56 is about 20 nanometers (nm) to about 45 nm and the width 58 is at least about 8 nm to about 10 nm and may be as large as 20 nm. As shown, each exemplary trench 54 is defined by a substantially vertical side or recessed surface 62 (proximate to gate 24) aligned with second spacer 50, a substantially horizontal bottom surface 64 parallel to top surface 14 of the fin structure 12, and a substantially vertical side surface 66 (remote from gates 24) aligned with second spacer 50.

Figure 6:
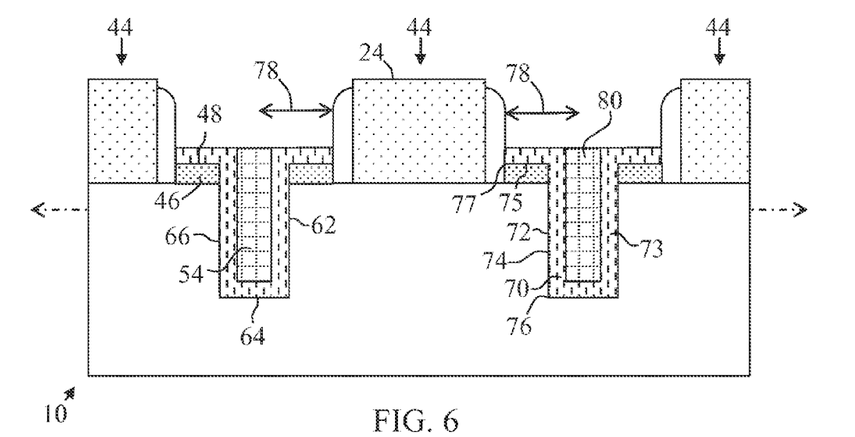

FIG. 6 illustrates further processing of the partially completed integrated circuit 10 in accordance with an embodiment. As shown, after formation of the trenches 54, the second spacers 50 are removed by a selective etch process. Then, a contact 70 having a contact surface 72 proximate to gate 24 is formed in each trench 54. In an exemplary process, a metal layer is deposited onto the surfaces 62, 64 and 66 of the trenches 54 and on the top surface 48 of the epitaxial material 46 and is reacted to form a metal silicide layer 73 of the contact 70. However, the contact material is not restricted to silicide: an appropriate metal may be used instead. In FIG. 6, the contact surface 72 of each contact 70 includes a vertical portion 74 formed on a trench side surface 62 facing the gate 24 and a horizontal portion 75 formed on the top surface 48 of the epitaxial material 46 between the trench 54 and the gate 24, such that the contact surface 72 extends from point 76 to point 77. (It is noted that the contact surface 72 may extend past point 76 along the bottom surface 62 of the trench 54, particularly in embodiments where the trench 54 does not extend below the lower gate surfaces 30). In the exemplary embodiment of FIG. 6, the length of the vertical portion 74 of each contact surface 72 is greater than the distance, indicated by double-ended arrow 78, which is half the distance D between gate structures 44. (Distance 78 is equal to the effective source/drain contact length for a transistor that lacks the trenches, 54, i.e., a conventional finFET.) Alternatively, the length of each vertical portion 74 is less than the distance 78 but the total contact surface length, including one vertical portion 74 and one horizontal portion 75 from point 76 to point 77, is greater than the distance 78. As is further shown, the vertical portions 74 of the contact surfaces 72 are substantially parallel to each other, and are substantially perpendicular to the fin axis 13.

Figure 7:
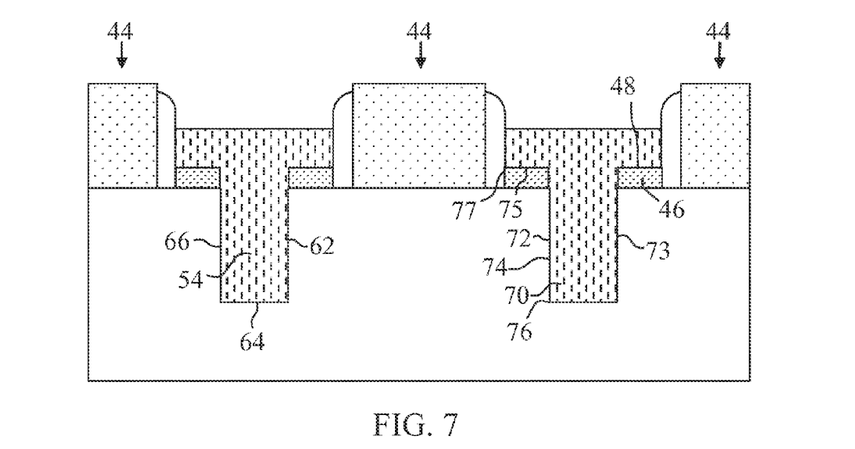

The process in FIG. 6 further illustrates the deposition of a contact metal 80 overlying each metal silicide layer 73 to fill each trench 54 and form contact 70. The contact metal 80 may be any suitable low resistance metal, such as tungsten, copper, or the like. Formation of the contact metal 80 in each trench 54 may include flush deposition of the metal in the trench 54 or, more typically, deposition to form an overburden of contact metal 80 above the trench 54 followed by removal of the overburden. FIG. 7 illustrates an alternative embodiment in which the contact metal 80 is not used. Specifically, the embodiment of FIG. 7 continues as in FIG. 6, with the removal of the second spacers 50 by a selective etch process. Then, contact 70 having a contact surface 72 is formed in each trench 54. In the process of FIG. 7, a metal layer is deposited onto the surfaces 62, 64 and 66 of the trenches 54 and on the top surface 48 of the epitaxial material 46 in a sufficient amount such that when reacted the metal silicide layer 73 forming contact 70 fills the trench 54. In such an embodiment, the trench 54 may be formed with a narrower width 58 (shown in FIG. 5). As a result, no contact metal 80 is needed to form contact 70. In an alternate embodiment, the layer 73 is formed from a non-silicide metal and fills the trench 54. As in FIG. 6, the length of each contact surface 72 in FIG. 7 is greater than the distance 78 (shown in FIG. 6) between gate structures 44. For example, the length of the vertical portion 74 of each contact surface 72 is greater than the distance 78. Alternatively, the length of each vertical portion 74 is less than the distance 78 but the total contact surface length, including one vertical portion 74 and one horizontal portion 75 from point 76 to point 77, is greater than the distance 78.

Figure 8:
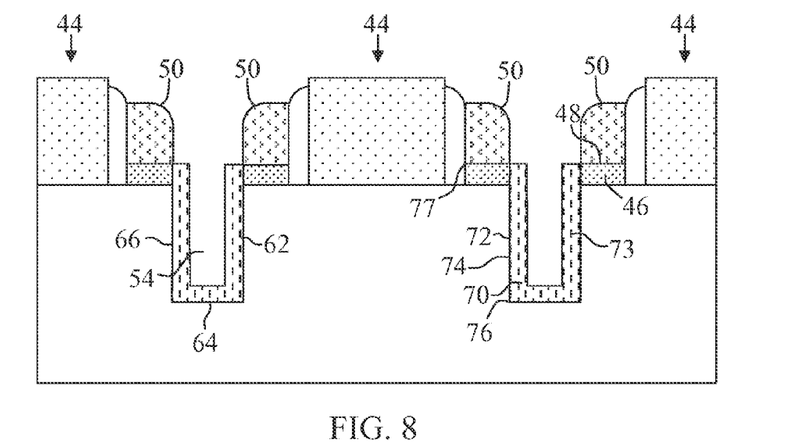

FIG. 8 illustrates another alternate embodiment in which the metal silicide process is performed before removing the second spacers 50. Specifically, the method continues after formation of the trenches 54 in FIG. 5 with deposition of a metal layer on the surfaces 62, 64 and 66 of each trench 54. As shown, the second spacers 50 block deposition of metal onto the top surface 48 of the epitaxial material 46. Thereafter, a silicide reaction forms the metal silicide layer 73 of the contact 70 on the surfaces 62, 64 and 66 of the trenches 54. While not shown, a contact metal may then be deposited over the metal silicide before removal of the second spacers 50. As in FIG. 6, the length of each contact surface 72 in FIG. 8 is greater than the distance 78 (shown in FIG. 6). For example, the length of the vertical portion 74 of each contact surface 72 is greater than the distance 78. Alternatively, the length of each vertical portion 74 is less than the distance 78 but the total contact surface length, including one vertical portion 74 and one horizontal portion 75 (formed during later processing such as in FIG. 10) from point 76 to point 77, is greater than the distance 78.

Figure 9:
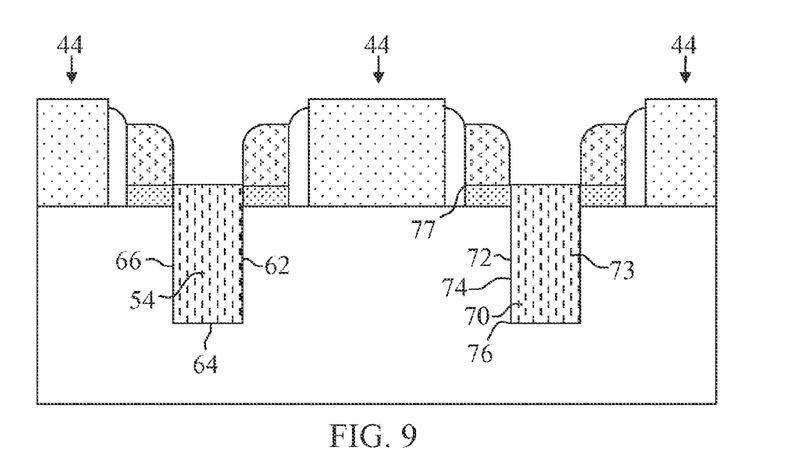

FIG. 9 illustrates an embodiment similar to that of FIG. 8, but where the metal silicide layer 73 alone forms a contact 70 completely filling each trench 54, as in FIG. 7. Specifically, a metal layer is deposited onto the surfaces 62, 64 and 66 of the trenches 54 in a sufficient amount such that, when reacted, the metal silicide layer 73 forming contact 70 fills the trenches 54. In such an embodiment, the trench 54 may be formed with a narrower width 58 (shown in FIG. 5). As a result, no contact metal 80 is needed to form contact 70. As in FIG. 6, the length of each contact surface 72 in FIG. 9 is greater than the distance 78 (shown in FIG. 6) between gate structures 44. For example, the length of the vertical portion 74 of each contact surface 72 is greater than the distance 78. Alternatively, the length of each vertical portion 74 is less than the distance 78 but the total contact surface length, including one vertical portion 74 and one horizontal portion 75 (formed during later processing) from point 76 to point 77, is greater than the distance 78.

Figure 10:
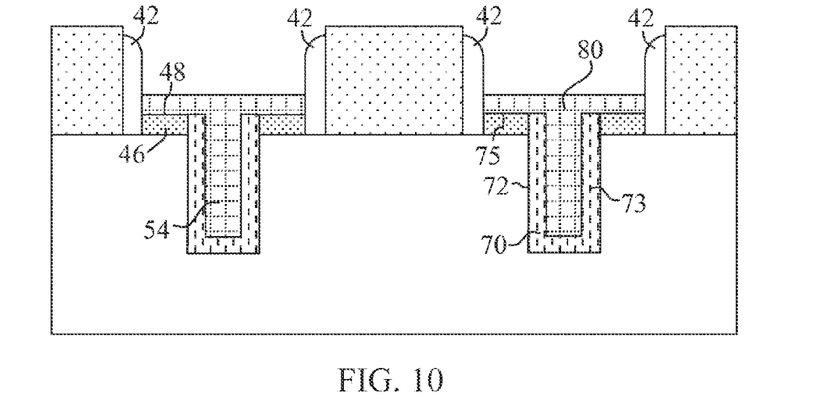

For embodiments where the metal silicide layer 73 does not fill the trenches 54, for example, the process of FIG. 8, FIG. 10 continues with the removal of the second spacers 50. In FIG. 10, a contact metal 80 is deposited over the metal silicide layer 73 and over the top surface 48 of the epitaxial material 46 to form contact 70 after second spacer removal. As shown, the contact metal 80 forms the horizontal portion 75 of the contact surface 72. Further, as shown, the contact metal 80 fills the trenches 54 and covers the epitaxial material 46 between first spacers 42.

Figure 11:
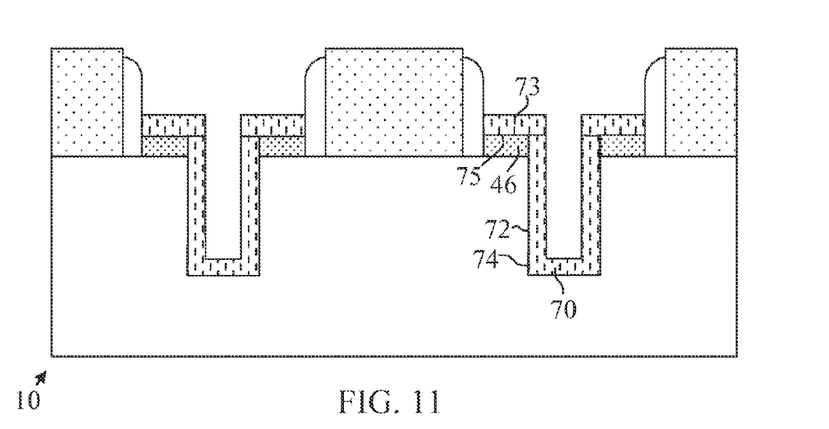

In an alternative embodiment shown in FIG. 11, following the method of FIG. 8, the second spacers 50 are removed and a second silicide process is performed to form a metal silicide layer 73 defining the horizontal portion 75 of the contact surface 72 on the epitaxial material 46. Such a process allows for formation of separate metal silicide layers 73 that form the vertical portions 74 and horizontal portions 75 with different thicknesses or different silicide materials. A contact metal (not shown) may thereafter be deposited over the contact 70. It is noted that the features of the processes described in FIGS.

6-11 may be combined or supplemented to provide contacts 70 with contact surfaces 72 having desired vertical portions 74 and horizontal portions 75 as well as desired metal silicide layers 73 and contact metals 80. In each embodiment, the length of each contact surface 72 is greater than the distance 78 (shown in FIG. 6) between gate structures 44. After contact formation, further typical processing may be performed, such as the connection of the contacts 70 to the metal interconnect structure of the integrated circuit 10. In all the above, including FIG. 6-11, the metal silicide can be replaced with an appropriate metal.

Figure 12:
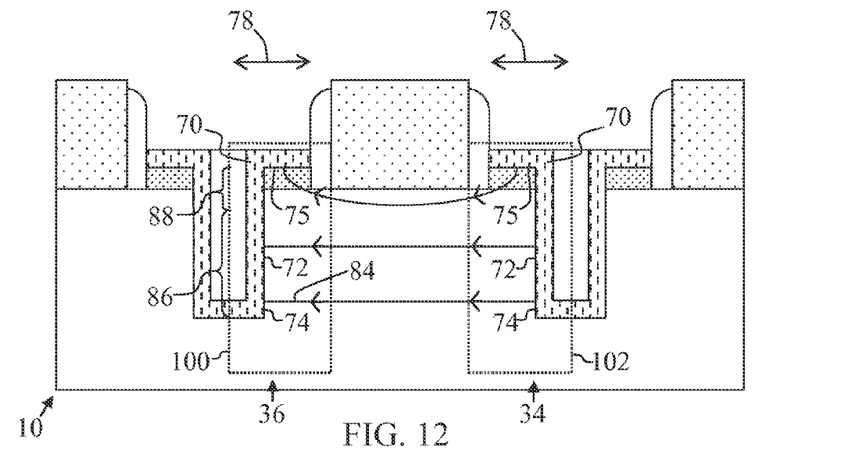
FIG. 12 illustrates, in cross-sectional view, current flow between source/drain contacts in an integrated circuit in accordance with various embodiments herein.

FIG. 12 illustrates current flow for an integrated circuit 10 as shown in FIG. 6 when a transistor is turned on. This is a PMOS finFET formed according to the description herein, where current flows from the source region 34 to the drain region 36. For an NMOS finFET, current would flow from the drain region 36 to the source region 34. In either case, the current flow paths, represented by arrows 84, are mostly linear. In particular, in the source/drain regions (i.e., within the rectangles 101 and 102 in FIG. 12), most of the paths are short and straight into the contacts. Specifically, for the portion of the contact labeled 86, which includes most of the vertical contact 74, the flow paths are straight and short. The paths are longer and curved only for the smaller contact portion labeled 88, which includes the horizontal contact 75 and just the upper part of the vertical contact 74. Compared to the current flow paths 84 in the source/drain (within rectangles 102 and 103) of a conventional finFET, shown in FIG. 13, the paths shown in FIG. 12 for a finFET according to this invention are overall considerably shorter and straighter, resulting in reduced parasitic source/drain resistance.

Figure 13:
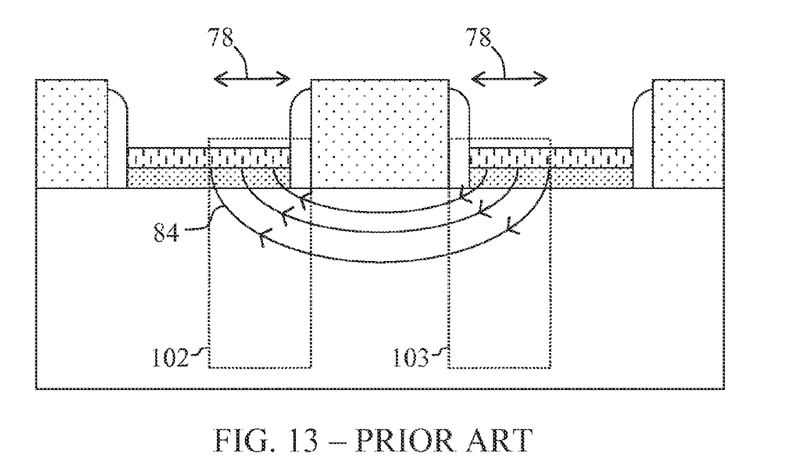
FIG. 13 illustrates, in cross-sectional view, current flow between source/drain contacts in a prior art conventional finFET.

In addition to providing linear current flow paths 84 in the integrated circuit 10 of FIG. 12, each contact 70 is provided with a contact length that is greater than distance 78, i.e., half the distance between adjacent gate structures. As shown in FIG. 13, distance 78 is equal to the effective contact length for a conventional finFET. Increasing the effective contact area by increasing the contact length in the finFET described herein further reduces parasitic source-drain resistance.

The integrated circuits and fabrication methods described herein result in improved contacts in source/drain regions in non-planar structures, such as fins in finFETs. As described above, parasitic source/drain resistance is reduced through the provision of short, linear flow paths to the contacts in the source/drain regions and through increased effective contact area due to increased contact length.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
    a semiconductor substrate;
    a fin structure overlying the semiconductor substrate having a source region, a drain region, and a channel region between the source region and drain region; wherein the source region and the drain region each have a recessed surface and an upper surface transverse to the recessed surface;
    a source contact formed on the upper surface of the source region and in contact with the recessed surface of the source region; and
    a drain contact formed on the upper surface of the drain region and in contact with the recessed surface of the drain region, wherein linear current paths are defined from the channel region to the source contact and from the channel region to the drain contact.

2. The integrated circuit of claim 1 wherein the source contact includes a lower portion adjacent the recessed surface, wherein the source contact includes an upper portion overlying and in contact with the upper surface of the source region, wherein the drain contact includes a lower portion adjacent the recessed surface, and wherein the drain contact includes an upper portion overlying and in contact with the upper surface of the drain region.

3. The integrated circuit of claim 1 further comprising:
    a gate transversely overlying the channel region, wherein the gate includes a first side and a second side;
    a first spacer overlying the fin structure and adjacent the first side of the gate;
    a second spacer overlying the fin structure and adjacent the second side of the gate; and
    epitaxial material overlying the fin structure and adjacent each spacer, wherein the epitaxial material defines the upper surface of the source region and the upper surface of the drain region, wherein the source contact is formed on the recessed surface in the source region and on the epitaxial material adjacent the first spacer, and wherein the drain contact is formed on the recessed surface in the drain region and on the epitaxial material adjacent the second spacer.

4. The integrated circuit of claim 1 wherein the fin structure is formed with a trench in the source region and a trench in the drain region, wherein each recessed surface bounds a portion of a respective trench, and wherein each contact is formed in a respective trench in the fin structure.

5. The integrated circuit of claim 1 wherein the upper surface of the source region is formed by a first layer of epitaxial material, and wherein the upper surface of the drain region is formed by a second layer of epitaxial material.

6. The integrated circuit of claim 1 wherein the fin structure is formed with a trench in the source region and a trench in the drain region, wherein each recessed surface bounds a portion of a respective trench and wherein each contact is formed in a respective trench in the fins structure by a metal filling the trench.

7. The integrated circuit of claim 1 further comprising:
    a first gate transversely overlying the channel region of the fin structure between the source region and the drain region; and
    a second gate transversely overlying the fin structure, wherein the first gate is distanced from the second gate by a first distance D, and wherein each contact defines a contact surface having a length greater than the D/2.

8. The integrated circuit of claim 1 further comprising:
    a gate transversely overlying the channel region of the fin structure between the source region and the drain region;
    a first spacer adjacent the gate and overlying the fin structure;
    a second gate transversely overlying the fin structure; and
    a second spacer adjacent the second gate and overlying the fin structure, wherein the first spacer is distanced from the second spacer by a first distance D, and wherein each contact defines a contact surface having a length greater than D/2.

9. An integrated circuit comprising:
a semiconductor substrate;
a fin structure overlying the semiconductor substrate and having a source region and a drain region, wherein the fin structure is formed with a source trench in the source region and a drain trench in the drain region;
a first gate structure transversely overlying the fin structure and defining a channel region between the source region and the drain region;
contacts formed in the source region and drain region, wherein each contact has a contact surface with a length, and wherein each contact is formed in a respective trench and includes a first metal formed in the respective trench and a contact metal overlying the first metal and located in the respective trench; and
a second gate structure transversely overlying the fin structure and distanced from the first gate structure by a first distance D, wherein D/2 is less than the length of each contact surface.

10. The integrated circuit of claim 9 wherein the first gate structure includes a first spacer and the second gate structure includes a second spacer, wherein the first spacer is distanced from the second spacer by the first distance D, and wherein the length of each contact surface is greater than D/2.

11. The integrated circuit of claim 9 wherein linear current paths are defined from the channel region though the source region and through the drain region to the contacts.

12. The integrated circuit of claim 9 wherein each trench is bound by a recessed surface, wherein the source region includes an upper surface located between the recessed surface of the source trench and the first gate structure, wherein the contact formed in the source region is formed on the upper surface of the source region, wherein the drain region includes an upper surface located between the recessed surface of the drain trench and the first gate structure, and wherein the contact formed in the drain region is formed on the upper surface of the drain region.

13. The integrated circuit of claim 9 wherein the fin structure has an upper surface, the first gate structure has a portion adjacent the fin structure having a lower gate surface at a first depth from the upper surface, and the source trench and drain trench each have a bottom surface located at a second depth from the upper surface greater than the first depth.

14. The integrated circuit of claim 9 wherein the first gate structure includes a first side and a second side, the integrated circuit further comprising:
epitaxial material overlying the fin structure, wherein each contact is partially formed on the epitaxial material.

15. A method for fabricating an integrated circuit, the method comprising:
forming a fin structure overlying a semiconductor substrate and having a source region, a drain region, and a channel region between the source region and the drain region;
forming a first gate structure transversely overlying the channel region of the fin structure;
forming a first spacer around the first gate structure;
forming a second spacer around the first spacer;
etching the fin structure while using the second spacer as a mask to form a trench in the source region and a trench in the drain region;
removing the second spacer; and
forming a source contact in the trench in the source region and a drain contact in the trench in the drain region and defining linear current paths from the channel region through the drain region to the drain contact and from the channel region through the source region to the source contact.

16. The method of claim 15 wherein the fin structure has a top surface, wherein each trench is bound by a recessed surface, wherein forming the source contact in the trench in the source region comprises forming the source contact over the top surface of the fin structure and on the recessed surface in the source region, and wherein forming the drain contact in the trench in the drain region comprises forming the drain contact over the top surface of the fin structure and on the recessed surface in the drain region.

17. The method of claim 15 wherein forming the source contact in the trench in the source region and the drain contact in the trench in the drain region comprises depositing a first metal in each trench and depositing a contact metal in each trench.

18. The method of claim 15 wherein a portion of the fin structure is exposed adjacent the first spacer, wherein the method further comprises growing an epitaxial material on the fin structure adjacent the first spacer, and wherein forming the second spacer comprises forming the second spacer over the epitaxial material.

19. The method of claim 15 wherein a portion of the fin structure is exposed adjacent the first spacer, wherein the method further comprises growing an epitaxial material on the fin structure adjacent the first spacer, wherein forming the second spacer comprises forming the second spacer over the epitaxial material, and wherein forming the source contact in the trench in the source region and the drain contact in the trench in the drain region comprises forming a portion of the source contact over the epitaxial material and forming a portion of the drain contact over the epitaxial material.

20. The method of claim 15 wherein the fin structure has a top surface, wherein forming the first gate structure comprises forming the first gate structure over a portion of the semiconductor substrate adjacent the fin structure, wherein the first gate structure has a lowest surface over the portion of the semiconductor substrate adjacent the fin structure at a first depth below the top surface, and wherein etching the fin structure comprises forming the trench with a bottom surface at a second depth below the top surface, wherein the second depth is greater than the first depth.

* * * * *